(12) United States Patent
Mizuochi et al.

(10) Patent No.: US 6,744,054 B2
(45) Date of Patent: Jun. 1, 2004

(54) EVACUATION USE SAMPLE CHAMBER AND CIRCUIT PATTERN FORMING APPARATUS USING THE SAME

(75) Inventors: Masaki Mizuochi, Hitachinaka (JP); Yoshimasa Fukushima, Hitachinaka (JP); Mitsuru Inoue, Utsunomiya (JP)

(73) Assignees: Hitachi, Ltd., Tokyo (JP); Canon Inc., Tokyo (JP)

(*) Notice: Subject to any disclaimer, the term of this patent is extended or adjusted under 35 U.S.C. 154(b) by 20 days.

(21) Appl. No.: 10/002,144

(22) Filed: Dec. 5, 2001

(65) Prior Publication Data

US 2002/0070345 A1 Jun. 13, 2002

(30) Foreign Application Priority Data

Dec. 8, 2000 (JP) ........................................ 2000-373757

(51) Int. Cl.[7] ................................................. G21K 5/08
(52) U.S. Cl. ................................................. 250/440.11
(58) Field of Search ........................ 250/492.1, 492.2, 250/492.3, 441.11; 73/663

(56) References Cited

U.S. PATENT DOCUMENTS

| | | | | |
|---|---|---|---|---|
| 4,475,223 A | * | 10/1984 | Taniguchi et al. | 378/34 |
| 4,528,451 A | | 7/1985 | Petric et al. | 250/441.1 |
| 4,584,479 A | | 4/1986 | Lamattina et al. | 250/441.1 |
| 4,818,838 A | | 4/1989 | Young et al. | 219/121.12 |
| 4,837,443 A | | 6/1989 | Young et al. | 250/441.1 |
| 4,851,097 A | * | 7/1989 | Hattori et al. | 204/192.33 |
| 5,254,856 A | * | 10/1993 | Matsui et al. | 250/310 |
| 5,493,125 A | | 2/1996 | Okayama et al. | 250/441.11 |

FOREIGN PATENT DOCUMENTS

| | | |
|---|---|---|
| JP | 54-058365 | 5/1979 |
| JP | 01-128525 | 5/1989 |
| JP | 03-023631 | 3/1991 |
| JP | 06-089686 | 3/1994 |
| JP | 08-017709 | 1/1996 |
| JP | 10-064467 | 3/1998 |
| JP | 11-260297 | 9/1999 |

* cited by examiner

Primary Examiner—John P. Lee
Assistant Examiner—Christopher M. Kalivoda
(74) Attorney, Agent, or Firm—Kenyon & Kenyon

(57) ABSTRACT

An evacuation use sample chamber is constituted by a top table 21 which is provided with a recessed portion disposed in a sample chamber main body 10 and for mounting a sample 8 and a groove portion surrounding the recessed portion; a stage 20 which holds the top table 21 and is displaceable in front and back, right and left and up and down directions together with the top table 21; a sample chamber cover 11 which covers above the sample chamber main body 10 including the top table 21; and an evacuation use pipe 21C which communicates with the groove portion and evacuates gas between the bottom face of the sample chamber cover 11 and the top face of the top table 21 including the sample 8. Thereby, an evacuation use sample chamber which performs a stable evacuation and keeps around a sample at a predetermined high vacuum and a circuit pattern forming apparatus which permits a highly accurate pattern drawing over the entire region of the sample are provided.

29 Claims, 7 Drawing Sheets

US 6,744,054 B2

EVACUATION USE SAMPLE CHAMBER AND CIRCUIT PATTERN FORMING APPARATUS USING THE SAME

BACKGROUND OF THE INVENTION

1. Field of the Invention

The present invention relates to a sample chamber which is maintained in high vacuum around a sample through evacuation therefrom and a circuit pattern forming apparatus using the same.

2. Conventional Art

In an apparatus which forms or inspects circuit patterns such as for a semiconductor device and a magnetic head and circuit patterns such as masks and reticles for forming circuit patterns for a semiconductor device, these circuit patterns are formed and inspected through irradiation of charged particles onto samples. In such instance, it is unavoidable that the charged particles, in particular electron beams have to be used in vacuum. For this reason, the circuit pattern formation and inspection is performed while placing samples in a gas evacuated vacuum chamber.

Hereinbelow, an electron beam pattern drawing apparatus which draws a circuit pattern on a sample by making use of electron beams will be explained taking up as an example.

An electron beam pattern drawing apparatus is one in which through generation of electron beams under a super high vacuum environment and scanning therewith LSI patterns are formed on a semiconductor substrate or a glass substrate called as a mask which is used for an exposure apparatus such as a stepper.

FIG. 12 shows a structure of a conventional electron beam pattern drawing apparatus. As shown in FIG. 12, electron beams 3 emitted from an electron gun 2 in a column 1 are shaped into a rectangular shape by a diaphragm 4 and a shaping deflector 5, and are image-formed on a desired position of a sample 8 by an electron lens 6 and a deflector 7. The sample 8 is fixed on an XY stage 9 through a sample holder or directly.

The position of the sample 8 on the XY stage 9 is managed by measuring the distance between a bar mirror 13 and a laser interference meter 12, and through feed forwarding the obtained information to the deflector 7 a highly accurate circuit pattern can be formed. Inside of a sample chamber 10 is kept in a high vacuum environment by a sample chamber use vacuum pump 17 to thereby prevent energy loss of the electron beams.

Now, a transportation route of the sample 8 will be explained.

The sample 8 is transported by a transportation device 16 in a load chamber 14 located adjacent to the sample chamber 10 from external in atmospheric circumstance into the load chamber 14, which is preliminarily gas-evacuated from atmospheric state into vacuum state a load chamber use vacuum pump 18. When the vacuum in the load chamber 14 reaches at the same level as that in sample chamber 10, a valve 15 is opened and the sample 8 is transported onto the XY stage 9. After completing pattern drawing, a reverse route is traced, in that inside of the load chamber 14 is returned from vacuum into atmospheric circumstance and thereafter, the sample 8 is transported into outside. With the above series of operations, the transportation of the sample can be carried out while keeping the sample chamber 10 in vacuum state, thereby, an improvement of throughput is achieved.

During drawing of a circuit pattern by an electron beam pattern drawing apparatus, it is necessary to keep the electron beam passage in high vacuum so as to prevent energy loss of the electron beams as has been referred to above, however, there were the following problems in conventional apparatuses.

(1) It was required to evacuate the entire sample chamber in high vacuum, therefore, a vacuum pump of high performance as well as large capacity was indispensable.

(2) Once the inside of the sample chamber was placed in atmospheric circumstance due to such as maintenance and failure thereof, it took a few hours to restore the circumstance into high vacuum which reduced available time of the apparatus.

(3) In order to keep the inside of the sample chamber in high vacuum, parts used inside the sample chamber were restricted to inactive materials and, in particular, many kinds of resins and lubricants could not be used.

(4) Mechanism which use gas such as air could not be mounted in the sample chamber.

In order to overcome the above problems, until now apparatuses which keep around the passage of the electron beams and a part of the stage in vacuum state are, for example, disclosed in JP-A-1-128525 (1989), JP-A-8-17709 (1996) and JP-B-3-23631 (1991). These apparatuses are provided with a flange 60 which includes a function of vacuum evacuation at the bottom face of the column 1 as shown in FIG. 13 and perform differential evacuation while managing the gap between the sample 8 and the flange 60.

In the flange 60 apertures 60A for vacuum evacuation are formed which permits differential evacuation with the circumference of the stage 9.

However, in the apparatuses as disclosed such as in JP-A-1-128525 (1989), JP-A-8-17709 (1996) and JP-B-3-23631 (1991), although it is possible to keep the electron beam passage in vacuum upto the sample 8 regardless to the atmosphere of the stage 9, a pressure difference due to a local differential evacuation is caused on the sample 8. Accordingly, at a top table 21 the region of the pressure difference varies in accordance with the displacement of the sample 8 which possibly causes attitude change of the top table 21 and deformation thereof.

Further, when performing pattern drawing (exposure, inspection) over the entire surface of a sample, because of the existence of a gap between edges of the sample 8 and a sample holding mechanism or the top table 21, amount of gas which flows in through the gap increases which makes difficult to obtain a stable vacuum. Namely, in order to keep a stable differential evacuation condition it is necessary to prevent the apertures 60A from protruding beyond the outer circumference of the sample 8 as shown in FIG. 13. As a result, in a range of distance R from outer circumference of the sample 8 toward the center thereof a pattern drawing can not be performed, thereby, a possible pattern drawing range around the outer circumference of the sample is wasted and a yielding of the sample 8 with regard to pattern drawing range is reduced.

SUMMARY OF THE INVENTION

An object of the present invention is to provide an evacuation use sample chamber which performs a stable evacuation and keeps around a sample at a predetermined high vacuum and a circuit pattern forming apparatus which permits a highly accurate pattern drawing over the entire region of the sample.

In order to achieve the above object, an evacuation use sample chamber according to the present invention is characterized, in that the evacuation use sample chamber is constituted by a table which is provided with a recessed portion disposed in a sample chamber main body and for mounting a sample and a groove portion surrounding the recessed portion; a stage which holds the table and is displaceable in front and back, right and left and up and down directions together with the table; a sample chamber cover which covers above the sample chamber main body including the table; and an evacuation use pipe which communicates with the groove portion and evacuates gas between the bottom face of the sample chamber cover and the top face of the table including the sample.

More specifically, the present invention provides the following sample chamber and device.

The present invention provides an evacuation use sample chamber which is characterized by comprising, a sample chamber main body; a table which is provided with a recessed portion disposed in the sample chamber main body and for mounting a sample and a groove portion surrounding the recessed portion; a stage which holds the table and is displaceable in front and back, right and left and up and down directions together with the table; a sample chamber cover which covers above the sample chamber main body including the table; and an evacuation use pipe which communicates with the groove portion and evacuates gas between the bottom face of the sample chamber cover and the top face of the table including the sample.

Preferably, the evacuation use sample chamber comprises a pressure gauge which permits measurement of pressure in a region surrounded by the sample chamber cover, the table and a passage of charged particle beams to be irradiated onto the sample.

Preferably, the sample chamber cover is provided with an open and close cover which opens and closes the passage of the charged particle beams to be irradiated onto the sample.

Preferably, the evacuation use sample chamber is provided with a means which evacuates a region surrounded by the sample chamber cover, the table, the passage of the charged particle beams and the open and close cover, measures pressure therein with the pressure gauge and operates the open and close cover after the measured pressure reaches at a same level as in a passage other than the region of the charged particle beams.

Preferably, the sample table includes a sample up and down moving mechanism which is used when transporting the sample.

Preferably, the height of the upper face at the outer circumferential side from the groove portion of the table is selected higher than the upper face at the inner circumferential side from the groove portion.

With the above structure, differential evacuation between the bottom face of the sample chamber cover and the top face of the table can be performed, thereby, the atmosphere around the sample can be kept in high vacuum. Further, since the inside of the groove which can always be evacuated is in vacuum condition, a pressure difference acting on the sample and the table is kept constant regardless to the movement of the sample. Thereby, the attitude accuracy of the table and the deformation state thereof are kept constant during pattern drawing. In the present specification "differential evacuation" implies an evacuation method in which a certain region is divided into different pressure (vacuum) regions of more than two.

Further, through evacuation via the evacuation use groove portion on the table while coming close the table toward the bottom face of the sample chamber cover, differential evacuation on the upper face of the table can be performed, and even in a case when the inside of the sample chamber is not in high vacuum, the passage of the charged particle beams upto the sample can be kept in high vacuum. Further, when carrying in the sample, the above differential evacuation is impossible, therefore, for the purpose of maintaining a predetermined degree of vacuum in the column, the open and close cover which closes a hole portion forming the passage of the charged particle beams is provided.

Further, the present invention provides an evacuation use device which is characterized by comprising a table which is provided with a recessed portion for mounting a sample and a groove portion surrounding the recessed portion; a stage which holds the table and is displaceable in front and back, right and left and up and down directions together with the table; a member which covers above the table; and an evacuation use pipe which communicates with the groove portion and evacuates gas between the bottom face of the member and the top face of the table including the sample.

Preferably, the evacuation use device comprises a pressure gauge which permits measurement of pressure in a region surrounded by the member, the table and a passage of charged particle beams to be irradiated onto the sample.

Preferably, the member is provided with an open and close cover which opens and closes the passage of the charged particle beams to be irradiated onto the sample.

Preferably, the distance between the recessed portion and the groove portion provided for the table is selected more than the radius of a passage hole for the charged particle beams provided at the bottom face of the open and close cover.

Preferably, the pressure gauge is provided at the open and close cover.

Preferably, the evacuation use device is provided with a means which evacuates a region surrounded by the member, the table, the passage of the charged particle beams and the open and close cover, measures pressure therein with the pressure gauge and operates the open and close cover after the measured pressure reaches at a same level as in a passage other than the region of the charged particle beams.

Preferably, the sample table includes a sample up and down moving mechanism which is used when transporting the sample.

Preferably, an air pad which evacuates gas is provided on the upper face of the table at the outer circumferential side from the groove portion.

Preferably, the height of the upper face of the air pad is selected lower than the upper face between groove portion and the air pad on the table.

Preferably, the height of the upper face of the air pad is selected higher than the upper face of the table at the outer circumferential side from the air pad.

Preferably, a gas lubrication is performed between the upper face of the pad and the bottom face of the member and the table is slidably moved by making use of the bottom face of the member as a guide face.

Further, the present invention is to provide a circuit pattern forming apparatus which comprises a column for irradiating charged particle beams onto a sample and an evacuation use sample chamber in which the sample is placed and which evacuates gas around the placed sample to keep vacuum therein and wherein under the condition kept in vacuum the charged particle beams are irradiated onto the upper face of the placed sample to form a circuit pattern on the upper face of the sample, which is characterized, in that the evacuation use sample chamber comprises a sample chamber main body; a table which is provided with a recessed portion disposed in the sample chamber main body and for mounting the sample and a groove portion surrounding the recessed portion; a stage which holds the table and is displaceable in front and back, right and left and up and down directions together with the table; a sample chamber cover which covers above the sample chamber main body including the table; and an evacuation use pipe which communicates with the groove portion and evacuates gas between the bottom face of the sample chamber cover and the top face of the table including the sample.

Further, the present invention is to provide a circuit pattern inspection apparatus which comprises a column for irradiating charged particle beams onto a sample on which a circuit pattern is formed and an evacuation use sample chamber in which the sample is placed and which evacuates gas around the placed sample to keep vacuum therein and wherein under the condition kept in vacuum the charged particle beams are irradiated onto the upper face of the placed sample to inspect the circuit pattern on the upper face of the sample, which is characterized, in that the evacuation use sample chamber comprises a sample chamber main body; a table which is provided with a recessed portion disposed in the sample chamber main body and for mounting the sample and a groove portion surrounding the recessed portion; a stage which holds the table and is displaceable in front and back, right and left and up and down directions together with the table; a sample chamber cover which covers above the sample chamber main body including the table; and an evacuation use pipe which communicates with the groove portion and evacuates gas between the bottom face of the sample chamber cover and the top face of the table including the sample.

DETAILED DESCRIPTION OF THE PREFERRED EMBODIMENTS

Hereinbelow, an evacuation use sample chamber and a circuit pattern forming apparatus representing one embodiment of the present invention will be explained, while taking an electron beam pattern drawing apparatus as an example, with reference to the drawings.

An electron beam pattern drawing apparatus is one in which through generation of electron beam under a super high vacuum environment and scanning therewith LSI patterns are formed on a semiconductor substrate or a glass substrate called as a mask which is used for an exposure apparatus such as a stepper.

At first, a first embodiment will be explained with reference to FIGS. 1 through 5.

Figure 1:
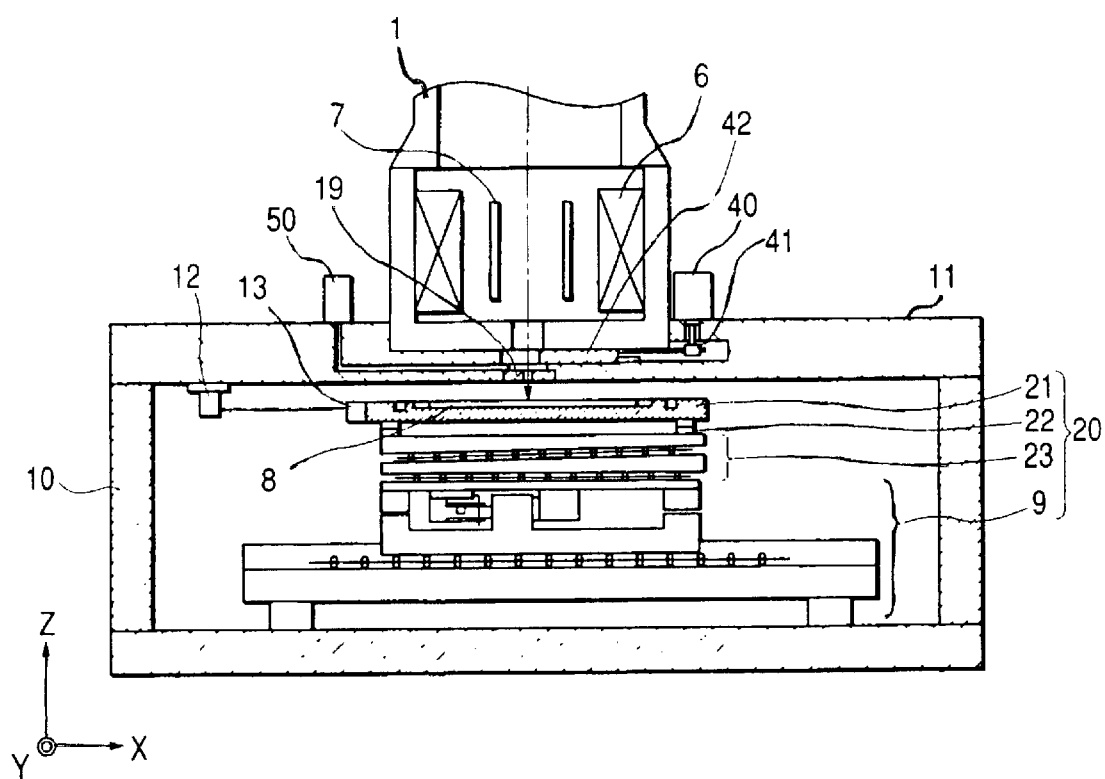
FIG. 1 is a constitutional diagram of an electron beam pattern drawing apparatus representing a first embodiment of the present invention.

FIG. 1 shows a constitution of an electron beam pattern drawing apparatus representing the first embodiment of the present invention. As shown in FIG. 1, a column 1 is mounted on a sample chamber cover 11, and inside a sample chamber (also called as a work chamber) 10 a sample stage (also called a sample displacement stand or a displacement table device) which is movable in XYZ directions in the drawing, namely an XYZ stage 20 is disposed. The sample chamber cover 11 is designed to be driven by a motor 40 and a friction drive mechanism 41 and is attached with an open and close cover 42 which maintains vacuum inside the column 1. In the XYZ stage 20, Z stage 23 movable in Z direction is mounted on an XY stage 9 movable in XY directions and a top table 21 which holds a sample 8 is coupled to the Z stage 23 by an expandable actuator 22. Further, a bar mirror 13 is attached to the top table 21 and through measurement by laser distance variation to a laser interference meter 12 management of sample position can be performed.

Figure 2:
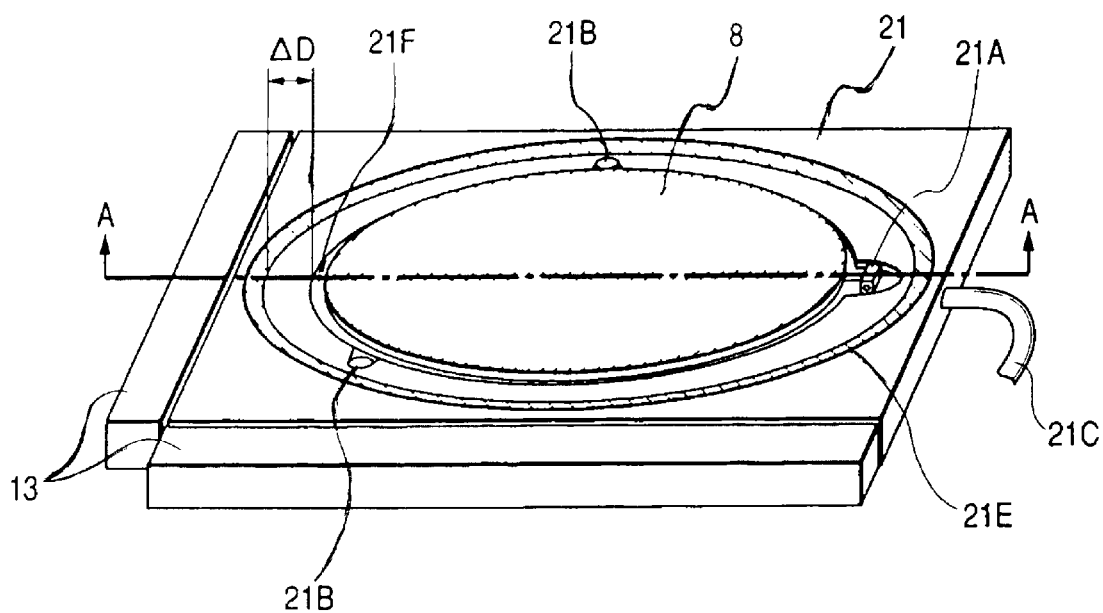
FIG. 2 is a perspective view of a top table in the electron beam pattern drawing apparatus in FIG. 1.
Figure 3:
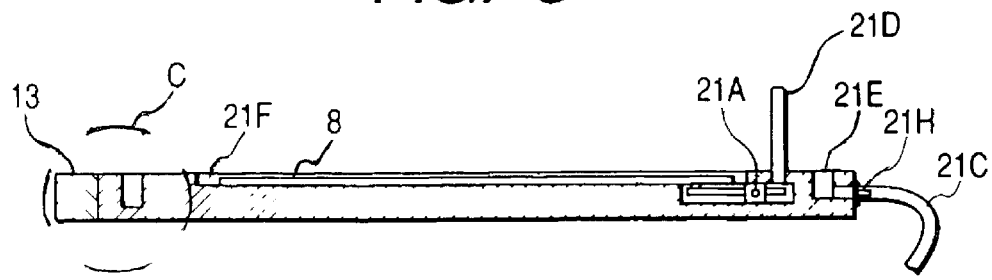
FIG. 3 is a cross sectional view taken along line A—A in FIG. 2.

The top table 21 will be explained with reference to FIGS. 2 and 3. FIG. 2 shows a perspective view of the top table 21 and FIG. 3 shows a cross sectional view taken along line A—A in FIG. 2.

On the top table 21, a sample use recessed portion 21F having depth of about the thickness of the sample 8 and an evacuation use groove portion 21E surrounding the same are formed, and pin Z mechanisms 21A which are used during sample transportation are attached below respective holes. Further, at the time of transportation a pin 21D passes through the hole 21B and acts on the pin Z mechanism to lift up the top table and to facilitate the sample transportation.

Further, in order to perform differential evacuation stably, it is necessary to keep flow rate of gas to be evacuated at constant. When it is designed in such a manner that distance AD between the sample use recessed portion 21F and the evacuation use groove portion 21E as illustrated in the drawing is determined more than the radius of an electron beam passage use hole formed in the bottom face of the sample chamber cover 11 and even when the edge of the sample is shifted in XY directions with reference to the center of column the electron beam passage use hole covers inside the evacuation use groove portion, a circuit pattern can be stably drawn over the entire surface of the sample.

Now, a series of flow from carrying in the sample into the sample chamber 10 to carrying out the same after completing a circuit pattern drawing will be explained. At a predetermined position of the XYZ stage 20 the sample 8 carried in is held on the top table 21 and the sample 8 is displaced immediately below the column 1. Thereafter, the top table 21 is displaced upward by the Z stage 23 into a detectable range of a Z sensor 19 which can detects position in height direction and inclination of the sample 8.

Subsequently, the distance between the upper face of the sample 8 and the bottom face of the sample chamber cover 11 and parallelism of the sample 8 with respect to the bottom face of the sample chamber cover 11 are detected by means of the Z sensor 19 and the actuator 22 is caused to expand or contract so as to assume a distance and parallelism which permit differential evacuation. While keeping a predetermined distance (a few $\mu$m–10 and a few $\mu$m) and parallelism, vacuum evacuation is performed through the evacuation use tube 21C so as to depressurize a region surrounded by the evacuation use groove portion 21E, the bottom face of the sample chamber cover 11 and the open and close cover 42, and the degree of vacuum in the region is measured by a pressure gauge 50 attached on the sample chamber cover 11.

After the region reaches to the degree of vacuum in the column 1, the open and close cover 42 is opened to start a pattern drawing. After completing the pattern drawing, the open and close cover 42 is closed to shield the inside of the column 1, and after terminating the evacuation from the top table 21, the sample 8 is lowered by driving the Z stage 23, then the sample 8 is carried out at the sample transportation position by displacing the XY stage 9.

Figure 4:
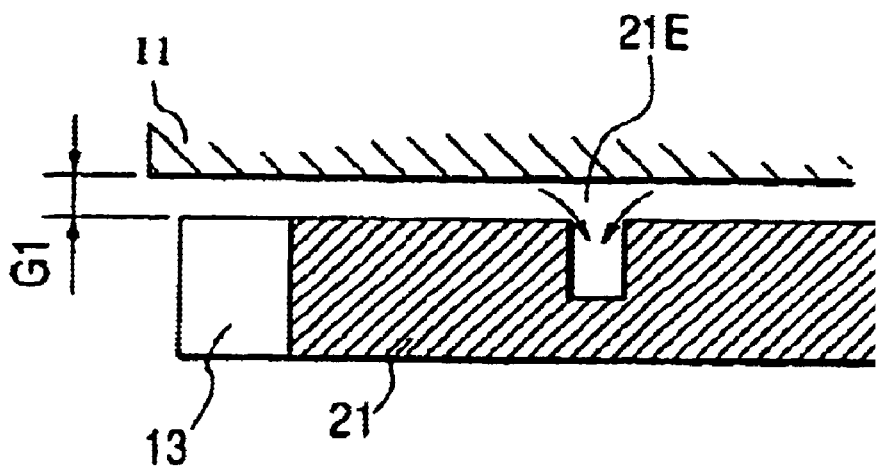
FIG. 4 is a detailed view of C portion in the top table in FIG. 3 and shows differential evacuation action around a wafer.

Now, the differential evacuation around a wafer will be explained with reference to FIG. 4.

Since the distance between the upper face of the top table 21 and the bottom face of the sample chamber cover 11 is narrow as from a few $\mu$m to 10 and few $\mu$m, when a flow rate of evacuated gas from the upper face of the top table 21 is sufficiently large with respect to a flow rate flowing into the evacuation use groove portion 21E from inside the sample chamber 10 being in low vacuum, depressurization rapidly advances after the start of evacuation because of small volume of the region surrounded by the evacuation use groove portion 21E, the bottom face of the sample chamber cover 11 and the open and close cover 42.

Figure 5:
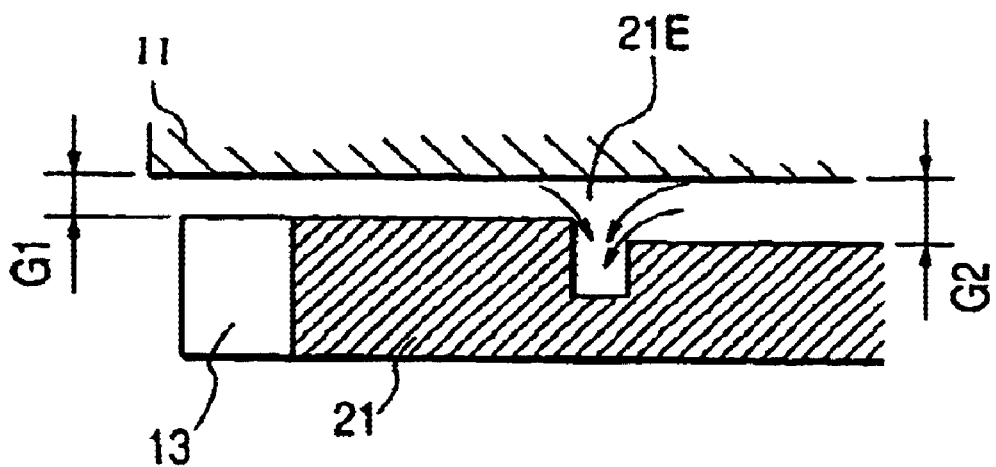
FIG. 5 is a view showing another example of differential evacuation action in FIG. 4.

Further, the smaller the distance G1 between the upper face of the top table 21 and the bottom face of the sample chamber cover 11, the less is the flow rate from the region in low vacuum. Accordingly, when it is designed to evacuate the environment around the sample 8 into high vacuum in the shortest time, it is sufficient as illustrated in FIG. 5 to provide a step in the top table 21 and to determine the distance G1 between the upper face of the top table 21 at the outer portion from the evacuation use groove portion 21E and the bottom face of the sample chamber cover 11 smaller than the distance G2 between the upper face of the top table 21 and the bottom face of the sample chamber cover 11.

Now, a second embodiment will be explained with reference to FIGS. 6 through 11.

Figure 6:
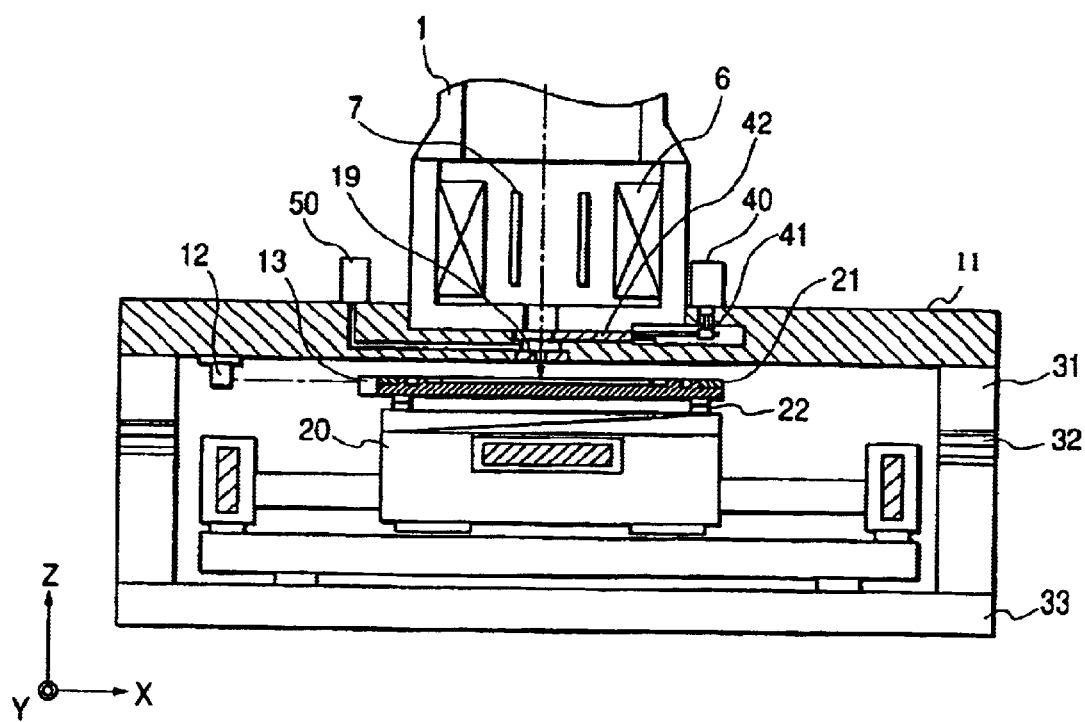
FIG. 6 is a constitutional diagram of an electron beam pattern drawing apparatus representing a second embodiment of the present invention.

FIG. 6 shows a constitution of an electron beam pattern drawing apparatus representing the second embodiment of the present invention.

As illustrated in FIG. 6, the XYZ stage 20 is guided by an air bearing and is movable in XYZ direction like the first embodiment, and in place of the sample chamber which maintains vacuum, the sample chamber cover 11, on which the column 1 is mounted, is supported by a framework 31 provided with a variation eliminating mechanism 32.

A region surrounded by the framework 31, a base disk 33 and the sample chamber cover 11 (which corresponds to the inside of the sample chamber in the first embodiment) is in the atmospheric state, therefore, such preliminary evacuation installation as the load chamber is unneeded for the sample transportation. Further, because of the use of the air bearing no lubricants such as lubricant oil are needed, therefore, possible contamination such as inside the column and parts around the sample can be greatly reduced.

Figure 7:
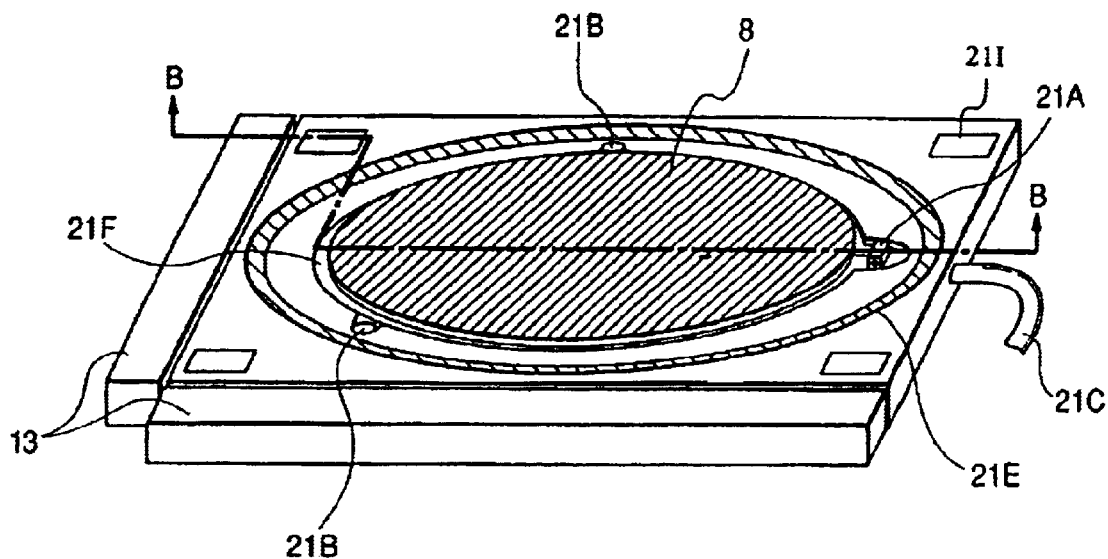
FIG. 7 is a perspective view of a top table in the electron beam pattern drawing apparatus in FIG. 6.
Figure 8:
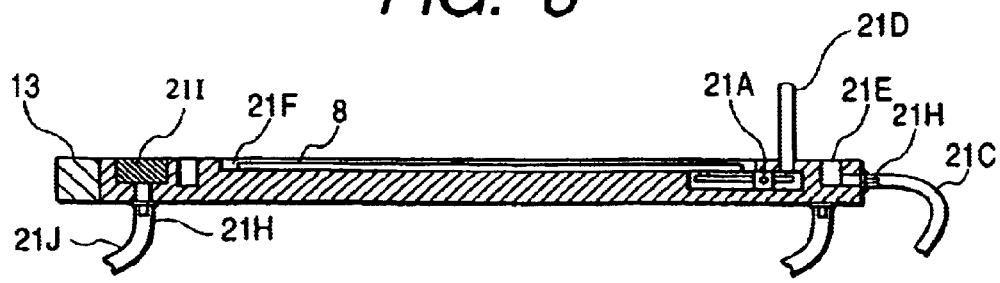
FIG. 8 is a cross sectional view taken along line B—B in FIG. 7.
Figure 9:
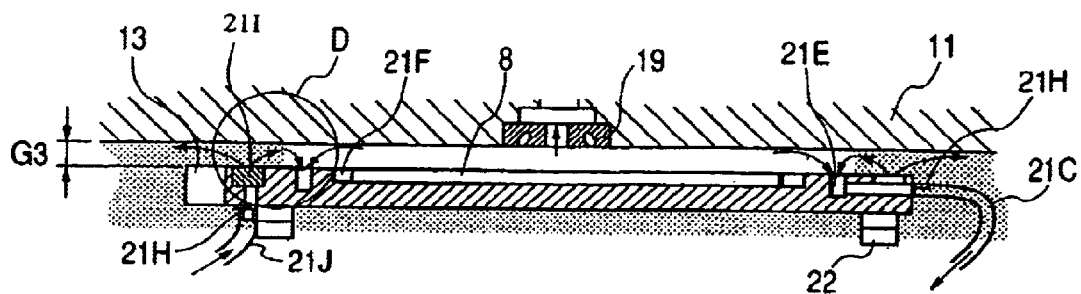
FIG. 9 is a view showing differential evacuation action around a wafer on the top table in FIG. 7.

The structure of the top table 21 and the differential evacuation of the second embodiment will be explained with reference to FIGS. 7 through 9. FIG. 7 shows a perspective view of the top table 21 of the second embodiment, FIG. 8 shows a cross sectional view taken along line B—B in FIG. 7, and FIG. 9 is a diagram showing the differential evacuation action.

The top table 21 is provided with, in addition to the mechanism as explained in connection with the first embodiment, an air pad 21I of a porous material such as ceramics which permits passing of gas and a gas supply use tube 21J which permits supply of compressed gas. In the present embodiment, through blowing out gas fed from the gas supply use tube 21J from the upper face of the air pad 21I, the top table 21 can be supported through the air bearing with respect to the bottom face of the sample chamber cover 11.

In the structure of the top table 21 as explained in connection with the first embodiment, when the environment around the top table 21 is in atmospheric pressure and the environment around the sample 8 is in high vacuum, a high pressure caused by the pressure difference will act onto the bottom face of the top table 21, thereby, the top table 21 possibly contacts to the bottom face of the sample chamber cover 11.

According to the second embodiment through the gas supply pressure from the air pad 21I the distance G3 between the top table 21 and the bottom face of the sample chamber cover 11 is kept constant and the above possible contact can be avoided.

Further, through managing the profile irregularity of the bottom face of the sample chamber cover 11, the top table 21 moves following the bottom face of the sample chamber cover 11, thereby, variation amount in the height direction of the top table 21 can be reduced.

Figure 10:
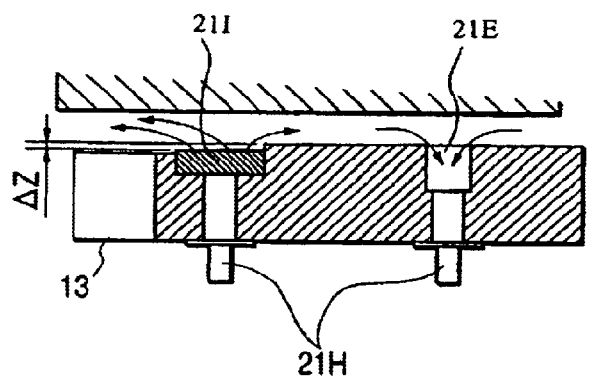
FIG. 10 is a detailed view of D portion in the top table in FIG. 9 and shows differential evacuation action around a wafer.

Further, FIG. 10 is an example where a step $\Delta Z$ is provided between the upper face of the air pad 21I and the upper face of the top table 21 at the outer circumferential side in order to reduce air flow rate flown in into the evacuation use groove portion 21E from the air pad 21I. In the present structure, since the distance G3 between the bottom face of the sample chamber cover 11 and the air pad 21I is selected larger than the distance G1 between the bottom face of the sample chamber cover 11 and the upper face of the top table 21, the air fed from the air pad 21I can be easily flown out from the top table 21, thereby, the environment around the sample can be kept in further higher vacuum.

Figure 11:
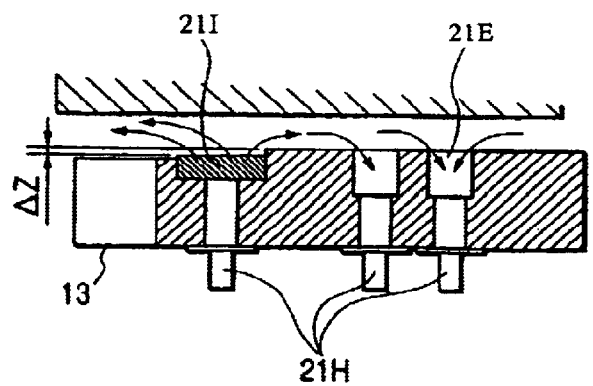
FIG. 11 is a view showing another example of differential evacuation action in FIG. 10.
Figure 12:
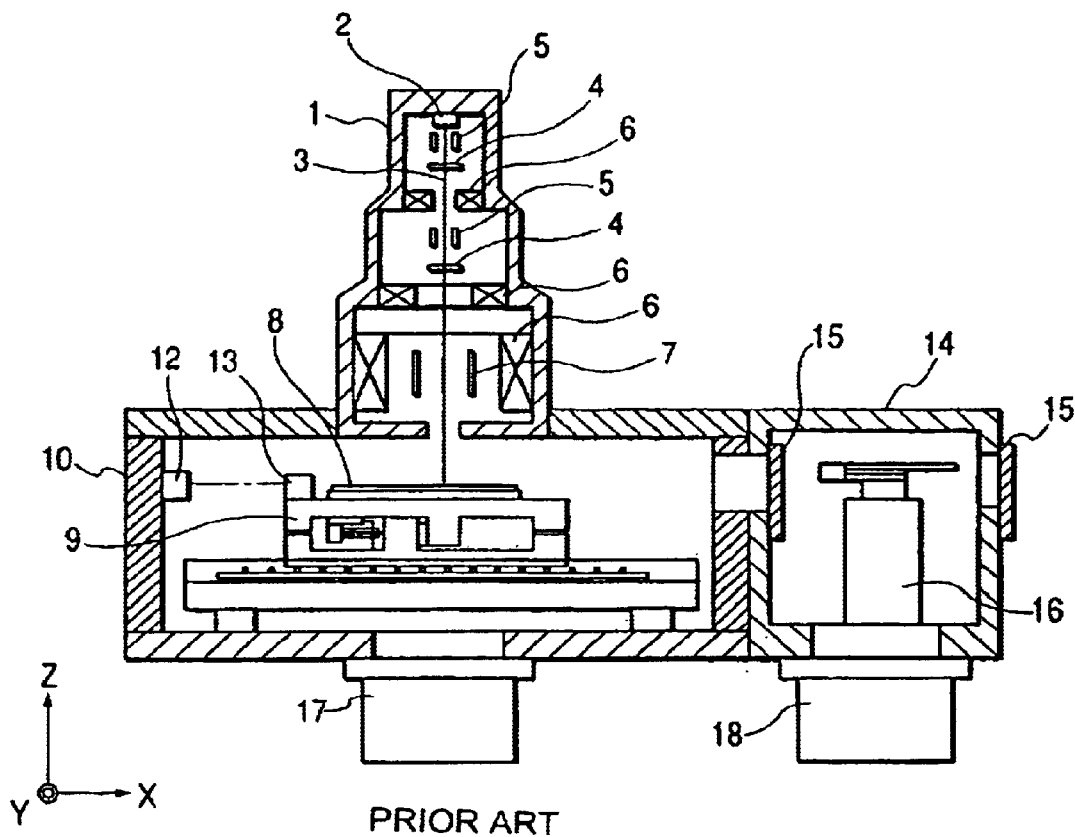
FIG. 12 is a constitutional diagram of a conventional electron beam pattern drawing apparatus.
Figure 13:
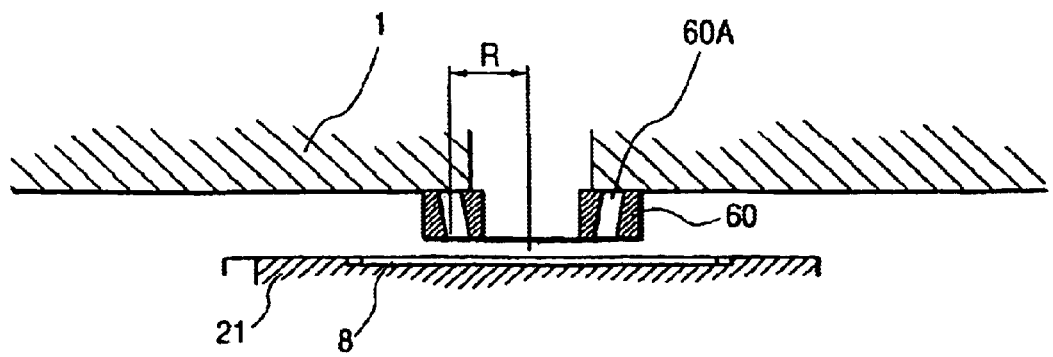
FIG. 13 is an enlarged view of a flange portion in the conventional electron beam pattern drawing apparatus.

Further, as shown in FIG. 11 through provision of the evacuation use groove portion in two or more steps, it is possible to evacuate around the sample more rapidly into a high degree of vacuum.

Hereinabove, the circuit pattern forming apparatuses have been explained by taking the electron beam pattern drawing apparatuses as examples, the circuit pattern forming apparatus of the present invention can be used as a circuit pattern inspection apparatus for inspecting circuit patterns for samples on which circuit patterns are already formed.

According to the present invention, through the stable gas evacuation the environment around the sample can be kept in high degree of vacuum constantly, thereby, an evacuation use sample chamber which can realize always stable vacuum is provided.

Further, through use of the evacuation use sample chamber a circuit pattern forming apparatus can be provided which permits a pattern drawing (exposure, inspection) over the entire face of a sample under environment condition of the sample chamber in low degree of vacuum or in atmospheric pressure while keeping the electron beam passage in high vacuum and without deteriorating the attitude accuracy of the top table.

What is claimed is:

1. A sample chamber comprising: a main body; a table disposed in the main body which is provided with a recessed portion for mounting a sample and a groove portion surrounding the recessed portion; a stage which holds the table and is displaceable together with the table; a cover which covers above the main body including the table; and a pipe which communicates with the groove portion and evacuates a gas between a bottom face of said cover and a top face of said table.

2. A sample chamber according to claim 1, further comprising a pressure gauge which permits measurement of pressure in a region surrounded by the cover, the table and a passage of charged particle beams to be irradiated onto the sample.

3. A sample chamber according to claim 2, wherein said cover is provided with an open and close cover which opens and closes the passage of the charged particle beams.

4. A sample chamber according to claim 3, further comprising a means which evacuates a region surrounded by the cover, the table, the passage of the charged particle beams and the open and close cover, measures pressure therein with the pressure gauge and operates the open and close cover after the measured pressure reaches at a same level as in a passage other than the region of the charged particle beams.

5. A sample chamber according to claim 1, wherein said table includes a sample up and down moving mechanism which is used when transporting the sample.

6. A sample chamber according to claim 1, wherein the height of the upper face at the outer circumferential side from the groove portion of the table is higher than the upper face thereof at the inner circumferential side from the groove portion.

7. An evacuation device comprising: a table which is provided with a recessed portion for mounting a sample and a groove portion surrounding the recessed portion; a stage which holds the table and is displaceable together with the table; a member which covers above the table; and a pipe which communicates with the groove portion and evacuates a gas between a bottom face of said member and a top face of said table.

8. An evacuation device according to claim 7, further comprising a pressure gauge which permits measurement of pressure in a region surrounded by the member, the table and a passage of charged particle beams to be irradiated onto the sample.

9. An evacuation device according to claim 8, wherein said member is provided with an open and close cover which opens and closes the passage of the charged particle beams to be irradiated onto the sample.

10. An evacuation device according to claim 9, wherein the distance between the recessed portion and the groove portion on the table is selected more than the radius of a passage hole for the charged particle beams provided at a bottom face of the open and close cover.

11. An evacuation device according to claim 9, wherein the pressure gauge is provided at the open and close cover.

12. An evacuation device according to claim 9, further comprising a means which evacuates a region surrounded by the member, the table, the passage of the charged particle beams and the open and close cover, measures pressure therein with the pressure gauge and operates the open and close cover after the measured pressure reaches at a same level as in a passage other than the region of the charged particle beams.

13. An evacuation device according to claim 7, wherein said table includes a sample up and down moving mechanism which is used when transporting the sample.

14. An evacuation device according to claim 7, further comprising an air pad which evacuates gas is provided on the upper face of the table at the outer circumferential side from the groove portion.

15. An evacuation device according to claim 14, wherein the height of an upper face of said air pad is lower than the upper face of said table between the groove portion and the air pad.

16. An evacuation device according to claim 14, wherein the height of the upper face of said air pad is higher than the upper face of the table at the outer circumferential side from the air pad.

17. An evacuation device according to claim 14, wherein a gas lubrication is performed between the upper face of said air pad and the bottom face of said member and said table is slidably moved by making use of the bottom face of the member as a guide face.

18. A circuit pattern forming apparatus which comprises a column for irradiating charged particle beams onto a sample and a sample chamber in which the sample is placed and which evacuates gas around the placed sample to keep vacuum therein and wherein under the condition kept in vacuum the charged particle beams are irradiated onto the upper face of the placed sample to form a circuit pattern on the upper face of the sample characterized, in that the sample chamber comprises a main body; a table disposed in the main body which is provided with a recessed portion for mounting the sample and a groove portion surrounding the recessed portion; a stage which holds the table and is displaceable together with the table; a cover which covers above the main body including the table; and a pipe which communicates with the groove portion and evacuates a gas between a bottom face of said cover and a top face of said table including the sample.

19. A circuit pattern inspection apparatus which comprises a column for irradiating charged particle beams onto a sample on which a circuit pattern is formed and a sample chamber in which the sample is placed and which evacuates gas around the placed sample to keep vacuum therein and wherein under the condition kept in vacuum the charged particle beams are irradiated onto the upper face of the placed sample to inspect the circuit pattern on the upper face of the sample characterized, in that the sample chamber comprises a main body; a table disposed in the main body which is provided with a recessed portion for mounting the sample and a groove portion surrounding the recessed portion; a stage which holds the table and is displaceable together with the table; a cover which covers above the main body including the table; and a pipe which communicates with the groove portion and evacuates a gas between the bottom face of said cover and a top face of said table including the sample.

20. A sample stage comprising:
  a table including a supporting portion for supporting a sample and an evacuation portion disposed at an outer region of the supporting portion;
  a moving mechanism for moving the table; and
  a pipe which communicates with the evacuation portion for evacuating gas over a face of the sample which is opposite from the face being supported by the supporting portion.

21. A sample chamber comprising:
- a table including a supporting portion for supporting a sample and an evacuation portion disposed at an outer region of the supporting portion;
- a moving mechanism for moving the table;
- a cover which covers above the table; and
- a pipe which communicates with the evacuation portion for evacuating gas in a space between a face of the sample which is opposite from the face being supported by the supporting portion and an inner face of the cover.

22. A pattern forming apparatus for forming a pattern on a sample comprising:
- a column including an irradiating portion which irradiates beams on to the sample;
- a table including a supporting portion for supporting a sample and an evacuation portion disposed at the outer region of the supporting portion;
- a moving mechanism for moving the table;
- a cover which covers the irradiating portion in the column and above the table; and
- a pipe which communicates with the evacuation portion for evacuating gas in a space between a face of the sample which is opposite from the face being supported by the supporting portion and an inner face of the cover.

23. A pattern inspection apparatus for inspecting a pattern formed on a sample comprising:
- a column including an irradiating portion which irradiates beams on to the sample;
- an inspection system for inspecting a pattern on the sample irradiated by the beams;
- a table including a supporting portion for supporting a sample and an evacuation portion disposed at an outer region of the supporting portion;
- a moving mechanism for moving the table;
- a cover which covers the irradiating portion in the column and above the table; and
- a pipe which communicates with the evacuation portion for evacuating gas in a space between a face of the sample which is opposite from the face being supported by the supporting portion and an inner face of the cover.

24. A sample chamber according to claim 1, wherein said stage is displaceable in front and back, right and left and up and down.

25. An evacuation device according to claim 7, wherein said stage is displaceable in front and back, right and left and up and down.

26. A circuit pattern forming apparatus according to claim 18, wherein said stage is displaceable in front and back, right and left and up and down.

27. A circuit pattern inspection apparatus according to claim 19, wherein said stage is displaceable in front and back, right and left and up and down.

28. A pattern forming apparatus for forming a pattern on a sample comprising:
- a column including an irradiating portion which irradiates beams on to the sample;
- a table including a supporting portion for supporting a sample and an evacuation portion disposed at an outer region of the supporting portion;
- a moving mechanism for moving the table; and
- a pipe which communicates with the evacuation portion for evacuating gas in a space between a face of the sample which is irradiated and the irradiating portion.

29. A pattern inspection apparatus for inspecting a pattern formed on a sample comprising:
- a column including an irradiating portion which irradiates beams on to the sample;
- an inspection system for inspecting a pattern on the sample irradiated by the beams;
- a table including a supporting portion for supporting a sample and an evacuation portion disposed at an outer region of the supporting portion;
- a moving mechanism for moving the table; and
- a pipe which communicates with the evacuation portion for evacuating gas in a space between a face of the sample which is irradiated and the irradiating portion.

* * * * *

UNITED STATES PATENT AND TRADEMARK OFFICE
CERTIFICATE OF CORRECTION

PATENT NO. : 6,744,054 B2
DATED : June 1, 2004
INVENTOR(S) : Mizuochi et al.

It is certified that error appears in the above-identified patent and that said Letters Patent is hereby corrected as shown below:

Column 11,
Lines 8 and 41, replace "between a face" with -- between a first face --
Lines 9 and 25, replace "from the face being" with -- from a second face being --

Column 12,
Line 1, replace "from the face" with -- from a second face --.

Signed and Sealed this

Seventeenth Day of May, 2005

JON W. DUDAS
*Director of the United States Patent and Trademark Office*